(12) United States Patent
Kim et al.

(10) Patent No.: US 9,034,676 B2
(45) Date of Patent: May 19, 2015

(54) METHOD OF FABRICATING VERTICAL TYPE LIGHT-EMITTING DIODE AND METHOD OF SEPARATING LAYERS FROM EACH OTHER

(75) Inventors: Ki-Seok Kim, Gwangju (KR); Gun-Young Jung, Gwangju (KR)

(73) Assignee: GWANGJU INSTITUTE OF SCIENCE AND TECHNOLOGY, Buk-Gu, Gwangju (KR)

( * ) Notice: Subject to any disclaimer, the term of this patent is extended or adjusted under 35 U.S.C. 154(b) by 227 days.

(21) Appl. No.: 13/696,490

(22) PCT Filed: Jul. 22, 2010

(86) PCT No.: PCT/KR2010/004809
§ 371 (c)(1),
(2), (4) Date: Nov. 6, 2012

(87) PCT Pub. No.: WO2011/139004
PCT Pub. Date: Nov. 10, 2011

(65) Prior Publication Data
US 2013/0052767 A1    Feb. 28, 2013

(30) Foreign Application Priority Data
May 6, 2010    (KR) .................. 10-2010-0042341

(51) Int. Cl.
*H01L 21/00*    (2006.01)
*H01L 33/00*    (2010.01)

(52) U.S. Cl.
CPC ................ *H01L 33/0079* (2013.01)

(58) Field of Classification Search
CPC .................................... H01L 33/0079
USPC ......... 438/46, 22, 478; 257/E21.09, E33.023, 257/E33.002
See application file for complete search history.

(56) References Cited

U.S. PATENT DOCUMENTS

2010/0276665 A1* 11/2010 Wang ............................ 257/15

* cited by examiner

*Primary Examiner* — Thien F Tran
(74) *Attorney, Agent, or Firm* — Nath, Goldberg & Meyer; Joshua B. Goldberg; Katelyn J. Bernier

(57) ABSTRACT

The present invention provides a method of fabricating a vertical type light-emitting diode and a method of separating layers from each other. Crystalline rods are provided on a lower layer or a lower substrate. The crystalline rods comprise ZnO. A layer which constitutes light-emitting diode or a light-emitting diode structure is formed on the crystalline rods, and the lower substrate is separated therefrom. The crystalline rods are dissolved during the separation. The formation of the crystalline rods is achieved by the formation of a seed layer and selective growth based on the seed layer.

17 Claims, 5 Drawing Sheets ant substrate is
provided on the p-type layer or a reflective layer. Then, the
sapphire substrate is separated, and an n-type electrode is
formed on an n-type layer.

Especially, the problem occurred during the formation of
the vertical type light-emitting diode is to separate the sapphire substrate, which is generally called a lift-off process in
the art. The lift-off process employed at present uses a laser.
The lift-off process using laser irradiates a laser beam to a
gallium nitride layer formed on the sapphire layer. The irradiated laser beam is transmitted through the sapphire substrate and then absorbed in the gallium nitride layer. The
absorbed energy separates the bonding of gallium nitride and
generates $N_2$ gas. The sapphire substrate and the gallium
nitride layer are separated from each other by the generated
$N_2$ gas, and thus a predetermined region on the surface of
gallium nitride is composed of metallic gallium, from which
nitrogen is excluded.

The lift-off process using laser has the problem that the
laser beam is completely absorbed in the gallium nitride layer.
That is, the irradiated laser beam is transmitted through the
gallium nitride layer to damage the crystalline structure of the
active layer having a multi-quantum well (hereinafter
referred to as MQW) structure. Moreover, a dislocation as a
line defect may occur in the gallium nitride layer forming a
buffer layer due to the energy of the laser beam. Especially,
the dislocation is a progressive defect and, as the power is
continuously supplied to the light-emitting diode, the dislocation becomes more severe.

To solve the problems occurring in the lift-off process, a
method of controlling the thickness of the gallium nitride
layer as the buffer layer or a method of controlling the energy
of the laser beam has been proposed in the art. However, such
methods cannot completely solve the problems occurring in
the lift-off process using laser. Therefore, a method of fabricating a new vertical type light-emitting diode, which can
prevent the damage of the gallium nitride layer and maintain
the crystallinity of the active layer due to the irradiation of the
laser beam, is required.

METHOD OF FABRICATING VERTICAL TYPE LIGHT-EMITTING DIODE AND METHOD OF SEPARATING LAYERS FROM EACH OTHER

This is a National Phase Application filed under 35 U.S.C.
371 as a national stage of PCT/KR2010/004809, filed Jul. 22,
2010, and claims priority from Korean Application No.
10-2010-0042341, filed May 6, 2010, the content of each of
which is hereby incorporated by reference in its entirety.

TECHNICAL FIELD

The present invention relates to a method of fabricating a
light-emitting diode and a method of separating layers from
each other and, more particularly, to a method of fabricating
a vertical type light-emitting diode and a method of separating layers from each other.

BACKGROUND ART

Since a silicon carbide light-emitting diode was first developed, technological advances in its structure and fabrication
method have progressed. Especially, a nitride light-emitting
diode and various fluorescent materials have been developed
in recent years, thereby implementing white light.

The nitride light-emitting diode has high chemical stability
and a mechanism capable of generating blue light. Recently,
the maximization of light efficiency and the improvement of
heat dissipation during packaging have been discussed. Especially, various attempts to solve the above problems by modifying the shape of a chip and its fabrication process, besides
the arrangement of a heat sink in a packaging process, have
been made.

The light-emitting diodes are divided into a normal type
light-emitting diode, a flip-chip type light-emitting diode, and
a vertical type light-emitting diode.

The normal type light-emitting diode has a structure in
which an electrode is formed on an n-type layer. However, it
is necessary to partially etch a p-type layer and an active layer
to expose the top of the n-type layer. Such a structure has the
problem that current flows along the interface of the active
layer in the vertical direction and flows in the lateral direction
toward the n-type electrode. Moreover, the current density in
the active layer adjacent to the n-type electrode is relatively
higher than that of the other area. Especially, a sapphire
substrate as a lower substrate remains in the chip process, and
thus it causes problem that cannot effectively dissipate heat
from a chip during the heat dissipation.

The flip-chip type light-emitting diode has a structure in
which a ball-shaped bump is formed on the n-type electrode
and the p-type electrode and is then bonded to a lower substrate. In general, the shape of the chip is the same as the
normal type light-emitting diode. That is, the region where
the n-type electrode is formed is produced by etching the
p-type layer and the active layer. The flip-chip type lightemitting diode has a mechanism in which light is emitted
toward the sapphire substrate and the heat dissipation is made
through the metal ball-shaped bump formed at the bottom.
Since the flip-chip type light-emitting diode includes the sapphire substrate having low thermal conductivity, it is difficult
to obtain good heat dissipation properties.

The vertical type light-emitting diode is considered as a
new alternative to solve the problems of the normal type and
flip-chip type light emitting diodes.

According to the vertical type light-emitting diode, a
nitride light-emitting diode is formed on a conventional non-conductive sapphire substrate, and an acceptor substrate is

DISCLOSURE OF INVENTION

Technical Problem

Therefore, it is a first object of the present invention to
provide a method of fabricating a vertical type light-emitting
diode, which can easily separate a substrate using wet or dry
etching.

It is a second object of the present invention to provide a
method of separating two layers from each other by interposing a crystalline structure between the two layers.

Solution to Problem

To achieve the first object, the present invention provides a
method of fabricating a vertical type light-emitting diode, the
method comprising: forming crystalline rods on a lower substrate; forming a light-emitting diode structure on the crystalline rods; providing an acceptor substrate on the lightemitting diode structure; and separating the lower substrate
from the light-emitting diode structure.

The first object of the present invention can also be
achieved by a method of fabricating a vertical type lightemitting diode, the method comprising: forming crystalline
rods on a lower substrate; forming a first semiconductor layer
on the crystalline rods; providing an acceptor substrate on the
first semiconductor layer; separating the first semiconductor layer from the lower substrate; and sequentially forming an active layer and a second semiconductor layer on the first semiconductor layer formed on the acceptor substrate.

To achieve the second object, the present invention provides a method of separating layers from each other, the method including: forming crystalline rods on a first layer; forming a second layer on the crystalline rods; and removing the crystalline rods to separate the first layer from the second layer.

Advantageous Effects of Invention

According to the present invention, crystalline rods are formed on a particular layer or a lower substrate. The crystalline rods comprise ZnO. The ZnO has high solubility with respect to an acidic solution. Moreover, the ZnO grows in a direction perpendicular to the particular layer or the lower substrate, and the aligned crystalline rods allow another layer to be easily formed thereon. Therefore, a specific semiconductor layer or a light-emitting diode structure is easily formed on the crystalline rods. The crystalline rods are dissolved by an acidic solution or an etching gas during separation of the lower substrate or the specific layer. Therefore, it is possible to facilitate the fabrication of a vertical type light-emitting diode and facilitate the separation of two layers. As a result, it is possible to easily separate the substrates without the use of a lift-off process using laser.

MODE FOR THE INVENTION

Figure 1:
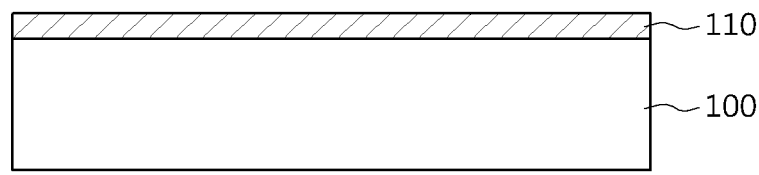
FIGS. 1 to 8 are cross-sectional views and a graph illustrating a method of fabricating a light-emitting diode in accordance with a first embodiment of the present invention.

The present invention can be variously modified and have several embodiments, and some exemplary embodiments are illustrated in the accompanying drawings and will be described in detail in the specification. However, the present invention is not limited to the specific embodiments and should be construed as including all the changes, equivalents, and substitutions included in the spirit and scope of the present invention. In the following description and drawings, like components refer to like reference numerals.

Unless indicated otherwise, it is to be understood that all the terms used in the specification including technical and scientific terms has the same meaning as those that are understood by those who skilled in the art. It must be understood that the terms defined by the dictionary are identical with the meaning of the context of the related art, and they should not be ideally or excessively defined formally unless the context clearly dictate otherwise.

Hereinafter, exemplary embodiments of the present invention will be described in detail with reference to the accompanying drawings.

First Embodiment

FIGS. 1 to 8 are cross-sectional views and a graph illustrating a method of fabricating a light-emitting diode in accordance with a first embodiment of the present invention.

Referring to FIG. 1, a seed layer 110 is formed on a lower substrate 100.

The lower substrate 100 may be a glass substrate, a sapphire substrate, an ITO substrate, a silicon substrate, a GaN substrate, a SiC substrate, a ZnO substrate, a GaAs substrate, an InP substrate, an AlN substrate, a ScAlMgO$_4$ substrate, or a LiNbO$_3$ substrate.

Moreover, the lower substrate 100 may not be a physical substrate, but may be the same as or different from a layer, which will be formed in the following process.

The seed layer 110 formed on the lower substrate 100 may be a zinc oxide particle layer containing zinc oxide particles having a predetermined size. If the material of the lower substrate 100 is the same as the seed layer 110, the formation of the seed layer 110 may be omitted. Therefore, if the lower substrate 100 is a ZnO substrate and the seed layer 110 to be formed comprises zinc oxide, the formation of the seed layer 110 may be omitted.

Moreover, the seed layer 110 may be formed by various methods. However, any method that can arrange a plurality of crystalline particles in a direction perpendicular to the lower substrate 100 to induce the growth of crystalline rods may be used.

For example, the seed layer 110 may be formed by a sol-gel method.

First, a hydrate containing zinc salt is dissolved in a solvent to prepare a first solution. The zinc salt may be zinc acetate, zinc nitrate, zinc sulfate, or zinc chloride. Moreover, the solvent may be a polar solvent. For example, the first solution may be prepared using ethanol as the solvent and ZnC$_4$H$_{10}$O$_6$.6H$_2$O as the hydrate.

Subsequently, the first solution is heated to form a sol. The heating temperature may be about 60° C. to 100° C. If the heating temperature is less than 60° C., the dissociation of the hydrate does not take place, whereas, if the heating temperature is more than 100° C., the ZnO crystals are not formed and overgrowth occurs in a dissociated state. The hydrate containing zinc salt is dissociated in the sol state. For example, if the ZnC$_4$H$_{10}$O$_6$.6H$_2$O is used as the hydrate, Zn$^{2+}$, CH$_3$COO$^-$, and H$_2$O are produced, and the ZnO crystals are formed by the heat applied in the dissociated state. The reaction can be represented by the following formula 1:

$$Zn^{2+}+H_2O+2CH_3COO^- \rightarrow ZnO+2CH_3COOH \qquad \text{[Formula 1]}$$

Next, a surfactant is added to the solution in the sol state. Any surfactant that has no reactivity with ions and various compounds remaining in the sol state and can increase the viscosity of the solution in the sol state and the dispersion of ion species may be used. Therefore, the surfactant may be polyethylene glycol (PEG) or hydroxypropyl cellulose (HPC).

Then, the surfactant and the solution in the sol state are heated to be mixed together, thus preparing a second solution. The heating temperature may vary according to the type of the surfactant. For example, if the PEG is used as the surfactant, the heating temperature may be about 40° C. to 80° C.

The second solution is spin-coated on the lower substrate 100 and heated to form a gel. The heating temperature may be about 200° C. to 1,000° C. If the heating temperature is less than 200° C., by-products other than ZnO contained in the second solution are not completely removed, whereas, if the heating temperature is more than 1,000° C., the crystallinity of the formed seed layer 110 may be damaged.

The seed layer 110 in the gel state has a preferred orientation in the c-axis direction. That is, the ZnO particles formed during the formation of the sol grow in the c-axis direction during the heating process after the spin-coating, which is the intrinsic characteristic of the ZnO crystal structure. That is, the ZnO crystals have a high growth rate in the [0001] direction and have a low growth rate in the lateral direction. Moreover, partial polarization of ZnO occurs on the (0001) plane, but does not occur in the lateral direction. Therefore, the ZnO particles in the seed layer 110 have crystalline properties that can grow in a direction perpendicular to the lower substrate 100 during the heating process after the spin-coating.

Alternatively, the seed layer 110 may be formed by a hydrothermal synthesis method.

For example, the seed layer 110 is formed by the hydrothermal synthesis method and, if the seed layer 110 comprises zinc oxide, a first growth solution containing a first zinc salt and a first precipitator is prepared.

The first growth solution may be prepared by dissolving the first zinc salt and the first precipitator in a polar solvent, respectively. The first zinc salt may be zinc acetate, zinc nitrate, zinc sulfate, or zinc chloride, and the first precipitator may be NaOH, $Na_2CO_3$, LiOH, $H_2O_2$, KOH, or $NH_4OH$. The polar solvent may comprise water, alcohol, or an organic solvent. Preferably, the polar solvent may contain both water and alcohol.

The ZnO particles may be formed by applying heat energy to the first growth solution. The application of heat energy may be performed in the temperature range of 50° C. to 100° C. at atmospheric pressure for 1 to 2 hours.

The reaction mechanism of the ZnO particles can be represented by the following formulas 2 to 6. In detail, when the first zinc salt solution and the first precipitation solution are mixed together, $Zn^{2+}$ in the first zinc salt solution and $OH^-$ in the first precipitation solution can produce $Zn(OH)_2$ as an intermediate by the following formula 2. When heat is applied to the mixed solution, the $Zn(OH)_2$ may be decomposed into $Zn^{2+}$ and $OH^-$ by the following formula 3.

When the concentration of $Zn^{2+}$ and $OH^-$ is increased by continuous decomposition, a ZnO core may be formed by a condensation reaction represented by the following formula 4. At the same time, a ZnO growth factor, $Zn(OH)_4^{2-}$, can be produced by the following formula 5. Subsequently, the ZnO growth factor, $Zn(OH)_4^{2-}$, may react with the ZnO core to produce a ZnO particle by the following formula 6.

$Zn^{2+} + 2OH^- \rightarrow Zn(OH)_2$      [Formula 2]

$Zn(OH)_2 \leftrightarrow Zn^{2+} + 2OH^-$      [Formula 3]

$Zn^{2+} + 2OH^- \rightarrow ZnO + H_2O$      [Formula 4]

$Zn(OH)_2 + 2OH^- \rightarrow Zn(OH)_4^{2-}$      [Formula 5]

$Zn(OH)_4^{2-} \rightarrow ZnO + H_2O + 2OH^-$      [Formula 6]

Moreover, a first overgrowth inhibitor is further added to the solution containing the ZnO particles, and the resulting solution is refluxed with a rotary evaporator to inhibit the overgrowth of the ZnO particles.

The first overgrowth inhibitor may be a cationic polymer. In detail, the cationic polymer may be a polymer having an amine group such as polyethyleneimine (PEI) having high solubility in a polar solvent, for example. The cationic polymer may have a hyperbranched structure. Therefore, the growth factors containing anions, $Zn(OH)_4^{2-}$, are bonded to the cations present in the branches of the polymer and do not participate in the growth of the ZnO cores, thereby preventing the ZnO particles from overgrowing.

The diameter of the ZnO particles can be controlled by adjusting the concentration of the first overgrowth inhibitor. That is, when the concentration of the first overgrowth inhibitor is increased, the diameter of the ZnO particles may be reduced.

The ZnO particles may be separated from the solutions. The ZnO particles may be separated by a centrifugal separator, and the separated ZnO particles may be washed with alcohol. The resulting ZnO particles are dried to yield the final ZnO particles. The drying may be carried out at a temperature of about 70° C.

The ZnO particles prepared in the above manner are prevented from overgrowing by the first overgrowth inhibitor, and thus it is possible to produce the ZnO particles having a uniform shape. The ZnO particles may have a nano-size, for example, a size of 3 nm to 5 nm.

The thus prepared ZnO particles are dissolved in a solvent and used to form the seed layer 110. The seed layer 110 may be formed by a solution process such as spin-casting. The solvent may be a polar solvent. The polar solvent may be ethanol, isopropyl alcohol, water, or distilled water. Preferably, the polar solvent may contain both water and ethanol.

Alternatively, the seed layer 110 may be formed by producing the ZnO particles by a reduction method and spin-casting the ZnO particles in a solvent. Moreover, the seed layer 110 may be formed by evaporation, metal organic chemical vapor deposition (MOCVD), sputtering or coating using a brush.

Figure 2:
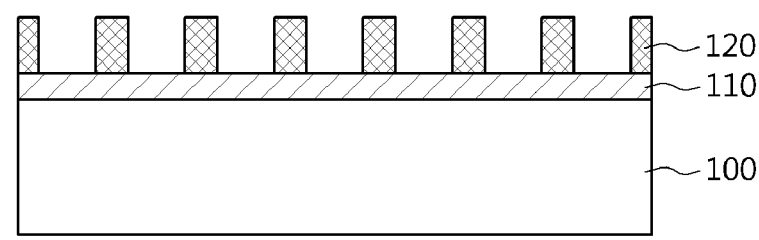

Referring to FIG. 2, a growth guiding layer 120 having a plurality of holes may be formed on the seed layer 110. The growth guiding layer 120 may be formed of a material different from that of the seed layer 110, Any material that is different from that of the seed layer 110 and can ensure chemical and thermal stability during the following process of forming crystalline rods may be used to form the growth guiding layer 120. Preferably, the growth guiding layer 120 may be a photoresist pattern. The photoresist pattern is formed by forming a photoresist layer on the seed layer 110 and then patterning the photoresist layer by lithography.

Therefore, the photoresist layer is formed by spin-coating and patterned by nanoimprint lithography, laser interference lithography, electron beam lithography, ultraviolet lithography, holographic lithography, or immersion lithography.

The growth guiding layer may have various shapes. The shape of the crystalline rods, which will be formed in the following process, may be determined by the shape of the growth guiding layer. The reason for this is that the crystalline growth does not proceed any longer in the seed layer closed by the growth guiding layer and the crystalline growth only proceed in the seed layer opened by the growth guiding layer. Therefore, hole areas opened by the growth guiding layer may have a rod or line shape spaced from each other.

Figure 3:
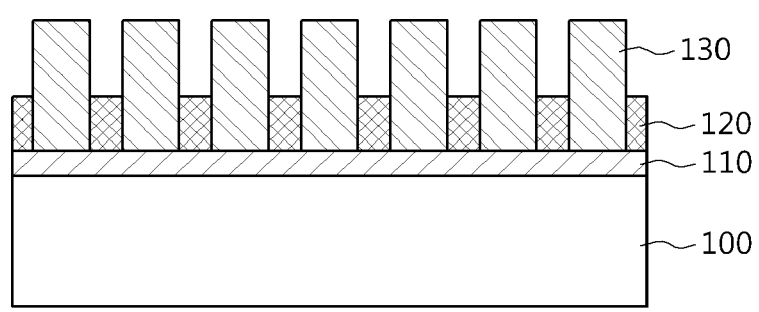

Referring to FIG. 3, crystalline rods 130 are formed in the holes of the growth guiding layer 120. Preferably, a crystalline rod 130 may be formed in each hole of the growth guiding layer 120. Therefore, the crystalline rod 130 may have a nano-size.

The crystalline rods 130 are formed on the seed layer 110 formed on the lower substrate 100. The crystalline rods 130 may be formed of the same material as the seed layer 110. Each of the crystalline rods 130 has a structure, in which the crystalline growth occurs predominantly in a specific direction, and the structure may partially have an amorphous structure in which the crystallinity is reduced, but the crystalline growth is the main factor in forming crystalline rods 130.

Therefore, if the seed layer 110 comprises zinc oxide, the crystalline rods 130 may comprise zinc oxide.

Moreover, the crystalline rods 130 are grown in a direction substantially perpendicular to the lower substrate 100 and have a regular or irregular arrangement with respect to the adjacent crystalline rods 130.

The diameter of the crystalline rods 130 formed by the described method may vary according to the fabrication method. That is, the degree of the growth may vary according to the chemical environment, processing time, temperature or pressure. Moreover, the shape and size of the crystalline rods 130 may be determined by the preferred growth direction. For example, if the crystalline growth in a direction perpendicular to the lower substrate 100 is much larger than the crystalline growth in the lateral direction, the crystalline growth in the lateral direction is significantly inhibited, and thus the diameter of the crystalline rods 130 may be smaller than the opposite case. Therefore, the crystalline rods 130 may have a nano- or micro-size.

Moreover, the shape of the crystalline rods 130 may be determined by the shape of the growth guiding layer 120. Therefore, the crystalline rods 130 may have a rod shape separated from each other or a line shape having a predetermined interval. In the following embodiments, the crystalline rods 130 may also have a rod shape separated from each other or a line shape having a predetermined interval. Moreover, the crystalline rods 130 may have various shapes such as a tube. The reason for this is that any shape may be used as long as the crystalline rods 130 of the present invention have excellent crystallinity, can contribute to the formation of layers, which will be formed in the following process, and can grow from the seed layer 110 on the substrate.

The crystalline rods 130 may be formed by the hydrothermal synthesis method. For example, if the crystalline rods 130 comprising zinc oxide are formed by the hydrothermal synthesis method, the crystalline rods 130 may be formed using a second growth solution containing a second zinc salt, a second precipitator, and a second overgrowth inhibitor.

First, after the lower substrate 100 including the growth guiding layer 120 is immersed in the second growth solution, heat energy is applied thereto. The application of heat energy may be performed in the temperature range of 50° C. to 100° C. at atmospheric pressure. If the heating temperature is less than 50° C., the growth of the crystalline rods 130 slows down, which makes it difficult to achieve a substantial growth of the crystalline rods 130, whereas, if the heating temperature is more than 100° C., the crystallinity of the crystalline rods 130 is damaged by an unexpected reaction between ion species in the second growth solution.

Hydrate containing the second zinc salt may be $Zn(NO_3)_2 \cdot H_2O$, $C_4H_6O_4Zn \cdot 2H_2O$, or $ZnSO_4 \cdot 7H_2O$. The second precipitator may be $C_6H_{12}N_4$, NaOH, or KOH, and preferably $C_6H_{12}N_4$. The $C_6H_{12}N_4$ can produce $NH_4^+$ and $OH^-$, which are the growth factors for forming the crystalline rods 130 comprising zinc oxide and, at the same time, can control the reaction rate since the growth rate and the $OH^-$ concentration can be easily controlled.

The second overgrowth inhibitor may comprise a cationic polymer. In detail, the cationic polymer may be a polymer having an amine group such as polyethyleneimine (PEI) having high solubility in a polar solvent.

The growth mechanism of the crystalline rods 130 comprising zinc oxide can be represented by the following formulas 7 to 13. Hexamine ($C_6H_{12}N_4$) used as the second precipitator can produce $NH_4^+$ and $OH^-$ by the following formulas 7 and 8. Moreover, $Zn(NO_3)_2$ used as the second zinc salt solution can produce zinc ions by the following formula 9.

$$C_6H_{12}N_4 + 6H_2O \leftarrow\rightarrow 6CH_2O + 4NH_3 \qquad \text{[Formula 7]}$$

$$NH_3 + H_2O \leftarrow\rightarrow NH_4^+ + OH^- \qquad \text{[Formula 8]}$$

$$Zn(NO_3)_2 \leftarrow\rightarrow Zn^{2+} + 2NO_3^- \qquad \text{[Formula 9]}$$

The $4NH_3$, $4OH^-$, and $Zn^{2+}$ produced by the above formulas 7 to 9 can produce $Zn(NH_3)_4^{2+}$ and $Zn(OH)_4^{2-}$, which are the growth factors of the ZnO crystalline rods 130, by the following formulas 10 and 11.

$$Zn^{2+} + 4NH_3 \rightarrow Zn(NH_3)_4^{2+} \qquad \text{[Formula 10]}$$

$$Zn^{2+} + 4OH^- \rightarrow Zn(OH)_4^{2-} \qquad \text{[Formula 11]}$$

The growth factor, $Zn(NH_3)_4^{2+}$, produced by the above formula 10 can produce the ZnO crystalline rods 130 represented by the following formula 12 by the reaction with $OH^-$ as a reaction factor, and the growth factor, $Zn(OH)_4^{2-}$, produced by the above formula 11 can produce the ZnO crystalline rods 130 by the following formula 13.

$$Zn(NH_3)_4^{2+} + 2OH^- \rightarrow ZnO + 4NH_3 + H_2O \qquad \text{[Formula 12]}$$

$$Zn(OH)_4^{2-} \rightarrow ZnO + H_2O + 2OH^- \qquad \text{[Formula 13]}$$

However, when the cationic polymer as the second overgrowth inhibitor is added to the second growth solution, the cationic polymer adsorbs $Zn(OH)_4^{2-}$, one of the growth factors, such that the $Zn(OH)_4^{2-}$ cannot participate in the growth of the crystalline rods 130 comprising zinc oxide. The $Zn(OH)_4^{2-}$ is known as a factor that allows the ZnO crystals to grow in the form of an open bundle or an urchin-like structure.

Therefore, the cationic polymer prevents the $Zn(OH)_4^{2-}$ from participating in the growth of the ZnO particles, and thus the ZnO crystals are prevented from growing in the form of an open bundle. Especially, the zinc oxide has a crystalline structure with a preferential growth in the c-axis direction. Partial polarization of zinc and oxygen occurs in the c-axis direction, i.e., the [0001] direction, but does not occur in the lateral direction. Therefore, the growth of the crystalline rods 130 may be predominant in the c-axis direction, i.e., the [0001] direction, even in a state where there is no particular inhibition to the growth. As a result, the growth in the lateral direction may also occur continuously.

If the second overgrowth inhibitor is used, the cationic polymer is adhered to the $Zn(OH)_4^{2-}$ and further caps the anionic $O^{2-}$ exposed to the side of the already formed ZnO crystal structure, thus inhibiting the growth in the lateral direction. Therefore, the second overgrowth inhibitor inhibits the growth of the crystalline rods 130 comprising zinc oxide in the lateral direction. Moreover, the crystalline rods 130 may grow in a direction perpendicular to the lower substrate 100 by the control of the growth factor.

In addition, it is possible to form one crystalline rod 130 in each hole of the growth guiding layer 120 by adjusting the concentration of the cationic polymer. For example, the cationic polymer may be added in an amount of 0.5 to 1 M with respect to 1 M of the second zinc salt.

Meanwhile, the second growth solution may have a pH of 9 to 11. If the growth solution has a pH above 11, the ZnO crystalline rods 130 may be damaged by excessive corrosion. Therefore, the second growth solution may have a pH of 10. For this purpose, an alkaline solution such as ammonia water may be added to the second growth solution.

The excess of OH⁻ contained in the second growth solution may corrode the ZnO crystalline rods already formed, thereby producing corrosion of Zn(OH)₂ as represented by the following formula 14. As a result, each of the ZnO crystalline rods 130 may have a pointed end like a pencil.

$$ZnO+3OH^-\rightarrow Zn(OH)_2+H_2O \quad \text{[Formula 14]}$$

However, the growth reaction of the ZnO crystalline rods 130 represented by the above formula 12 may continue along with the corrosion reaction. Referring to formula 12, the OH⁻ is consumed as the ZnO crystals grow, and thereby the pH of the second growth solution may be reduced. As a result, the growth reaction predominantly occurs rather than the corrosion reaction, which results in the production of ZnO crystalline rods 130.

The crystalline rods 130 may be formed by other methods. For example, the crystalline rods 130 may be formed by chemical vapor deposition (CVD), physical vapor deposition (PVD), or atomic layer deposition (ALD), in which a source gas is supplied to the top of the exposed seed layer and the growth of crystals is used.

Figure 4:
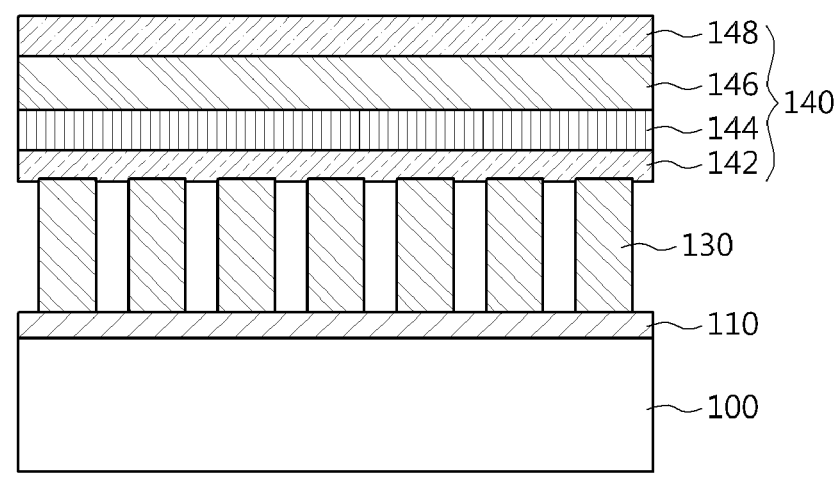

Referring to FIG. 4, a light-emitting diode structure 140 is formed on the lower substrate 100 on which the crystalline rods 130 are formed. The growth guiding layer 120 may be removed before the formation of the light-emitting diode structure 140. Especially, if the growth guiding layer 120 is a photoresist pattern, it may be easily removed by an ashing process or a wet process. If necessary, the following process may be performed in a state where the growth guiding layer 120 remains.

If the growth guiding layer 120 comprises a photoresist pattern, it may be removed using a removal gas or a removal solution. The photoresist removal gas may be Ar/O₂ or He/O₂, and the photoresist removal solution may be acetone.

The light-emitting diode structure 140 formed on the crystalline rods 130 may comprise a group III-nitride material. For example, the light-emitting diode structure 140 may comprise gallium nitride. Alternatively, the light-emitting diode structure 140 may comprise a group II-oxide.

If the light-emitting diode structure 140 comprises a group III-nitride, for example, a first semiconductor layer 144 is formed on the crystalline rods 130. The first semiconductor layer 144 may be an n-type gallium nitride layer. Especially, if the first semiconductor layer 144 comprises gallium nitride, a group IV element may be used as a dopant. Especially, the gallium nitride has a lattice mismatch of about 2% with respect to zinc oxide and has a hexagonal crystalline structure, which is the same as or similar to the crystalline structure of the zinc oxide. Therefore, the n-type gallium nitride can be easily formed over the ZnO crystalline rods 130 without distortion of the crystalline structure.

In this embodiment, a buffer layer 142 may be formed on the crystalline rods 130 before the formation of the first semiconductor layer 144. The buffer layer 142 is used to reduce the lattice mismatch between the crystalline rods 130 and the first semiconductor layer 144. Therefore, if the first semiconductor layer 144 comprises gallium nitride, the buffer layer 142 may comprise gallium nitride or aluminum nitride.

Figure 5:
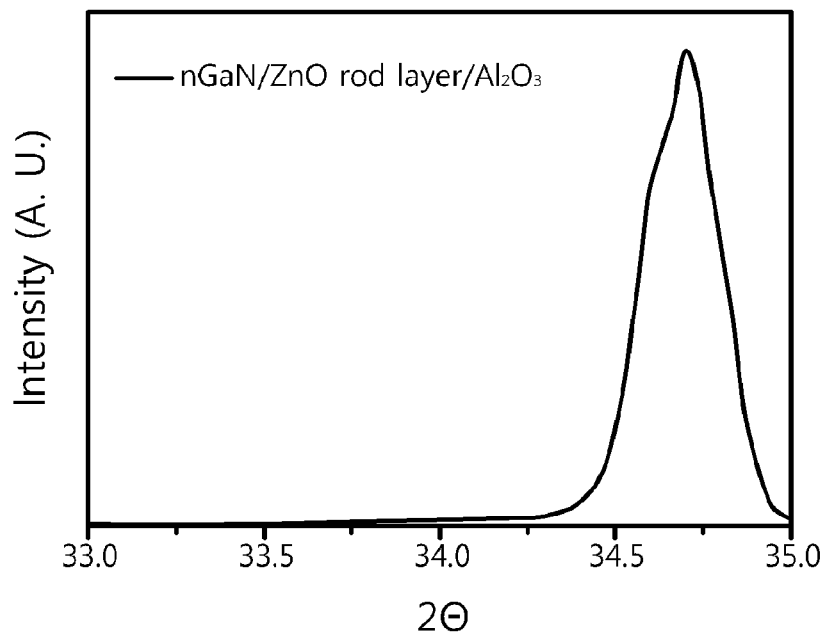

FIG. 5 is an X-ray diffraction (XRD) pattern illustrating the formation of the first semiconductor layer on the crystalline rods.

Referring to FIG. 5, the seed layer is formed on the sapphire substrate by the sol-gel method. The crystalline rods comprising zinc oxide are formed on the seed layer by the hydrothermal synthesis method described in this embodiment. Each of the crystalline rods has a hexagonal shape, a length of 600 nm, and a diameter of 250 nm. The pitch between the crystalline rods is 400 nm.

The first semiconductor layer comprising GaN is formed on the crystalline rods using silicon as a dopant. Therefore, the first semiconductor layer is an n-type GaN layer. The first semiconductor layer has a thickness of 200 um.

It can be seen from the XRD pattern that a peak at 34.8°(2θ) is observed, which indicates that the GaN layer has crystallinity and the surface of the GaN layer is the (0001) plane. Moreover, the reason that no peak is observed on other planes is that the first semiconductor layer comprises single crystals.

Subsequently, an active layer 146 is formed on the first semiconductor layer 144. Recombination of electrons and holes occurs predominantly in the active layer 146, and thus the active layer 146 may have a depletion region formed by a p-n junction, a quantum dot structure, or a quantum well structure. Preferably, the active layer 146 may have the MQW structure in which a barrier layer and a well layer are alternately stacked. Moreover, the active layer 146 may comprise a ternary system such as InGaN or a quaternary system such as InAlGaN.

A second semiconductor layer 148 is formed on the active layer 146. The second semiconductor layer 148 has a complementary relationship with the first semiconductor layer 144. Therefore, if the first semiconductor layer 144 is an n-type semiconductor layer, the second semiconductor layer 148 is a p-type semiconductor layer. Moreover, if the second semiconductor layer 148 is a p-type GaN layer, the dopant may be a group II element.

Figure 6:
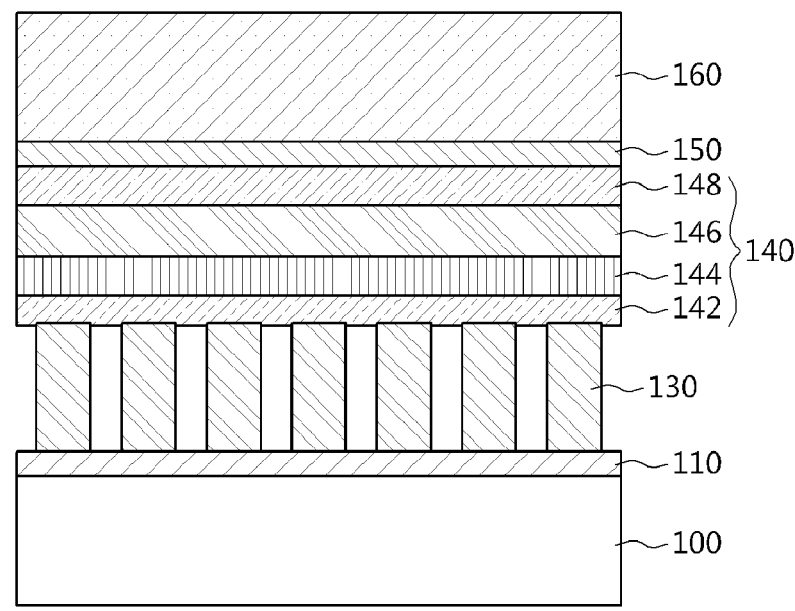

Referring to FIG. 6, an acceptor substrate 160 is provided on the light-emitting diode structure 140. In this embodiment, a reflective layer 150 may be interposed between the light-emitting diode structure 140 and the acceptor substrate 160. The reflective layer 150 may be formed of a metal material. Therefore, the reflective layer 150 may comprise silver or aluminum. Moreover, the acceptor substrate 160 may be formed of a conductive material. Therefore, the acceptor substrate 160 comprises Si, SiC, GaAs, GaP, AlGaInP, Ge, SiSe, GaN, AlInGaN, or InGaN. Moreover, the acceptor substrate 160 may comprise Al, Zn, Ag, W, Ti, Ni, Au, Mo, Pt, Cu, Cr, or Fe, or alloys thereof.

Figure 7:
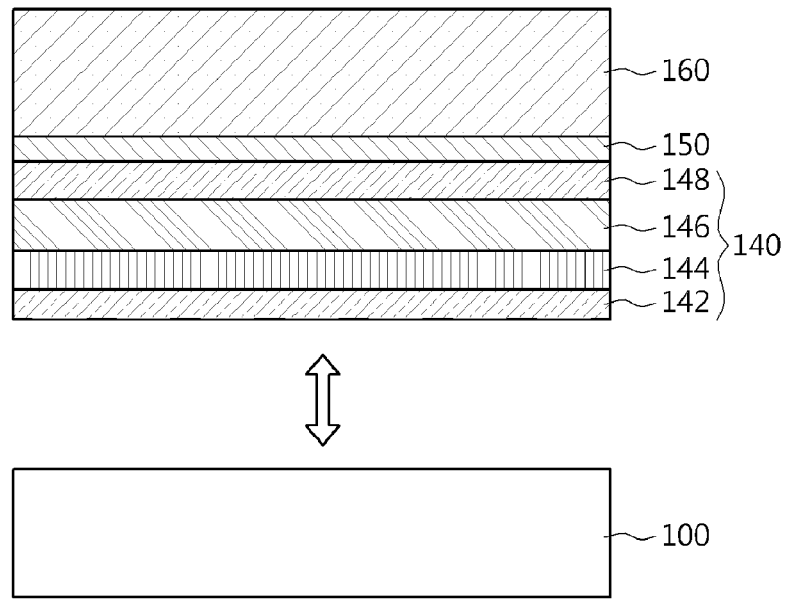

Referring to FIG. 7, the lower substrate 100 and the light-emitting diode structure 140 are separated from each other. The separation of the lower substrate 100 from the light-emitting diode structure 140 is performed by means of the crystalline rods 130. That is, the ZnO crystalline rods 130 have a chemical composition different from that of the light-emitting diode structure 140 and have an etch selectivity for a particular solution. Therefore, if an etching solution is injected into the crystalline rods 130, the lower substrate 100 and the light-emitting diode structure 140 are easily separated from each other.

The separation of the lower substrate 100 from the light-emitting diode structure 140 can be achieved by immersing the lower substrate 100 and the light-emitting diode structure 140 in an etching solution. The etching solution dissolves the crystalline rods 130 interposed between the lower substrate 100 and the light-emitting diode structure 140. If the crystalline rods 130 comprise zinc oxide and the light-emitting diode structure 140 comprises a group III-nitride, the etching solution may be an acidic solution. Any acidic etching solution may be used without any limitations. Preferably, the etching solution may have a pH of 3 to 6. The dissolution mechanism of the crystalline rods 130 can be represented by the following formula 15:

$$ZnO+CH_3COO^-+H_3O^+ \leftrightarrow Zn(OH)_2+CH_3COOH \quad \text{[Formula 15]}$$

The Zn(OH)$_2$ produced by the above formula reacts with water to produce Zn(OH)$_4^{2-}$. Therefore, as the dissolution of the crystalline rods 130 proceeds, the pH of the solution is increased.

Moreover, the separation of the lower substrate 100 from the light-emitting diode structure 140 can be easily achieved by supplying an etching gas. That is, the separation of the lower substrate 100 from the light-emitting diode structure 140 can be achieved by supplying an etching gas to the crystalline rods 130 spaced from each other. The etching gas may be hydrogen or chlorine gas. The hydrogen or chlorine gas reacts with the zinc of the crystalline rods 130 comprising zinc oxide to produce by-products such as ZnH$_2$, ZnCl$_2$, etc.

The light-emitting diode structure 140 is deposited on the acceptor substrate 160 in the above-described manner.

Figure 8:
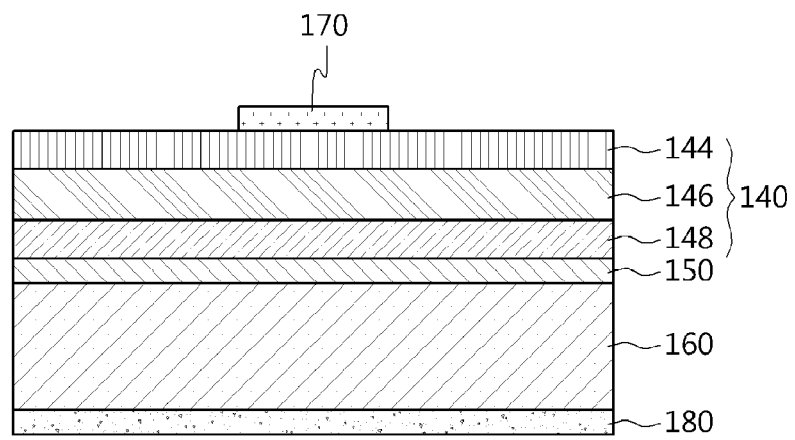

Referring to FIG. 8, a first electrode 170 is formed on the first semiconductor layer 144, which faces the acceptor substrate 160, and a second electrode 180 is formed on the rear surface of the acceptor substrate 160. If the buffer layer 142 is used in the process of manufacturing the light-emitting diode structure 140, the buffer layer 142 may be removed by an appropriate method before the formation of the first electrode 170.

A current spreading layer (not shown) formed of a transparent conductive material may be further interposed between the first electrode 170 and the first semiconductor layer 144.

Moreover, the crystalline rods 130 may remain on the lower substrate 100 or on the light-emitting diode structure 140 during the separation of the lower substrate 100 from the light-emitting diode structure 140. If the crystalline rods 130 remain on the light-emitting diode structure 140, the crystalline rods 130 can be removed by wet etching, washing, or mechanical polishing.

Second Embodiment

FIGS. 9 to 12 are cross-sectional views illustrating a method of fabricating a light-emitting diode in accordance with a second embodiment of the present invention.

Figure 9:
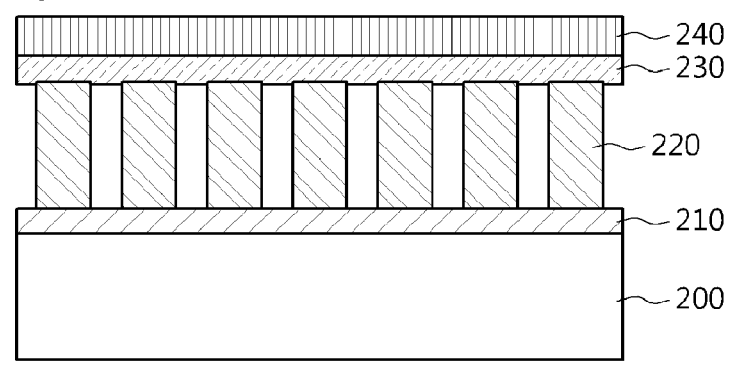
FIGS. 9 to 12 are cross-sectional views illustrating a method of fabricating a light-emitting diode in accordance with a second embodiment of the present invention.

Referring to FIG. 9, a seed layer 210, crystalline rods 220, a buffer layer 230, and a first semiconductor layer 240 are sequentially formed on a lower substrate 200. In this embodiment, the formation of the buffer layer 230 may be omitted.

The seed layer 210 and the crystalline rods 220 are formed on the lower substrate 200 in the same manner as the first embodiment shown in FIGS. 1 to 3.

Moreover, the buffer layer 230 and the first semiconductor layer 240 are also formed on the crystalline rods 220 in the same manner as the first embodiment. That is, although the active layer 146 and the second semiconductor layer 148 are further provided in the first embodiment, the present embodiment shown in FIG. 9 provides only the seed layer 210, the crystalline rods 220, the buffer layer 230, and the first semiconductor layer 240. In this embodiment, the buffer layer 230 may be formed before the formation of the first semiconductor layer 240.

Figure 10:
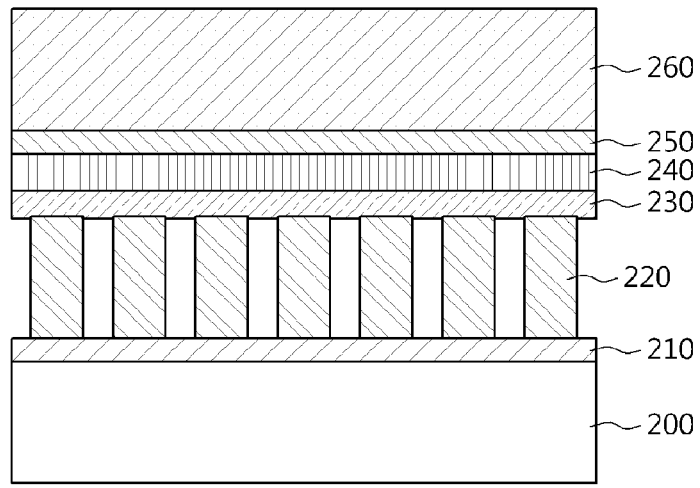

Referring to FIG. 10, an acceptor substrate 260 is attached to the upper surface of the first semiconductor layer 240 shown in FIG. 9.

In this embodiment, a reflective layer 250 may be interposed between the first semiconductor layer 240 and the acceptor substrate 260. Preferably, the reflective layer 250 may be formed of a metal material. Therefore, the reflective layer 250 may comprise silver or aluminum. Moreover, the acceptor substrate 260 may be formed of a conductive material. Therefore, the acceptor substrate 260 comprises Si, SiC, GaAs, GaP, AlGaInP, Ge, SiSe, GaN, AlInGaN, or InGaN. Moreover, the acceptor substrate 260 may comprise Al, Zn, Ag, W, Ti, Ni, Au, Mo, Pt, Cu, Cr, or Fe, or alloys thereof.

Figure 11:
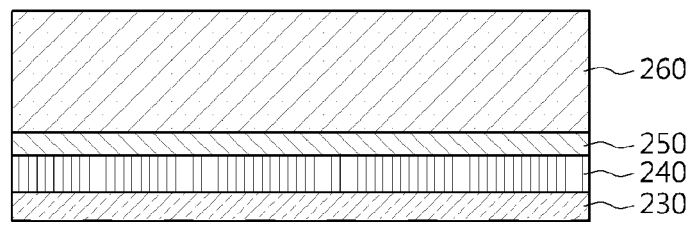
Figure 11:
Figure 11:
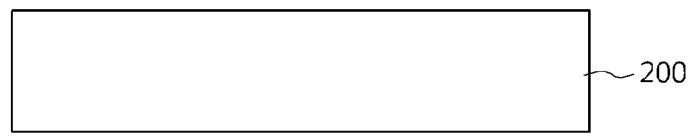

Referring to FIG. 11, the lower substrate 200 is separated, and the acceptor substrate 260 and the first semiconductor layer 240 formed below the acceptor substrate 260 remain. The separation of the lower substrate 200 from the first semiconductor layer 240 is performed by means of the crystalline rods 220. If the buffer layer 230 is provided, the separation is performed between the buffer layer 230 and the lower substrate 200. The buffer layer 230 is removed by wet etching, for example, and the first semiconductor layer 240 remains on the acceptor substrate 260. Moreover, the reflective layer 250 may be interposed between the first semiconductor layer 240 and the acceptor substrate 260.

The crystalline rods 220 for the separation of the lower substrate 200 may comprise zinc oxide, have a chemical composition different from that of the buffer layer 230 or the first semiconductor layer 240, and have an etch selectivity for a particular solution. Therefore, if an etching solution is injected into the crystalline rods 220, the lower substrate 200 is easily separated in the same manner as the first embodiment.

That is, the separation of the lower substrate 200 can be achieved by immersing the resulting substrate in an etching solution. The etching solution dissolves the crystalline rods 220. If the crystalline rods 220 comprise zinc oxide and the buffer layer 230 or the first semiconductor layer 240 comprises a group III-nitride, the etching solution may be an acidic solution. Any acidic etching solution may be used without any limitations. Preferably, the etching solution may have a pH of 3 to 6. The dissolution mechanism of the crystalline rods 220 can be represented by the above formula 15.

Moreover, the separation of the lower substrate 200 can be easily achieved by supplying an etching gas. That is, the separation of the lower substrate 200 can be achieved by supplying an etching gas to the crystalline rods 220 spaced from each other. The etching gas may be hydrogen or chlorine gas. The hydrogen or chlorine gas reacts with the zinc of the crystalline rods 220 comprising zinc oxide to produce by-products such as ZnH$_2$, ZnCl$_2$, etc.

Figure 12:
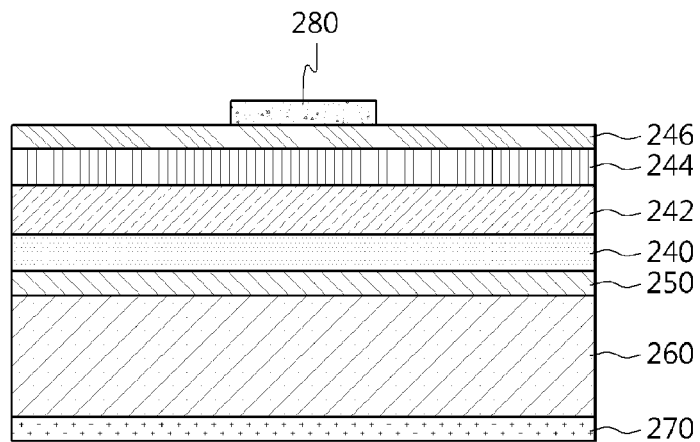

Referring to FIG. 12, an active layer 242 and a second semiconductor layer 244 are formed on the first semiconductor layer 240. The formation method and the chemical composition of the active layer 242 and the second semiconductor layer 244 are the same as the first embodiment.

Moreover, a first electrode 270 is formed on rear surface of the acceptor substrate 260, and a second electrode 280 is formed on the second semiconductor layer 244. A current spreading layer 246 formed of a transparent conductive material may be further interposed between the second electrode 280 and the second semiconductor layer 244. The current spreading layer 246 may comprise ITO, IZO, or the like, generally used in the art.

Third Embodiment

Figure 13:
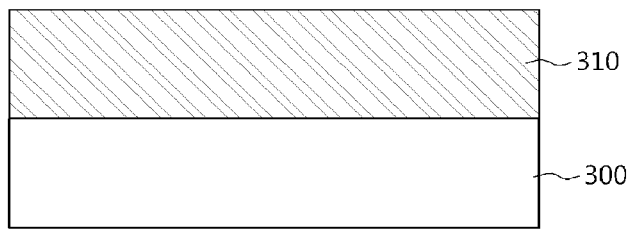
FIGS. 13 to 15 are cross-sectional views illustrating a method of fabricating a light-emitting diode in accordance with a third embodiment of the present invention.
Figure 14:
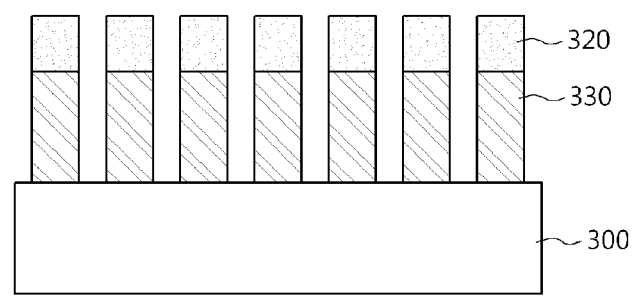
Figure 15:
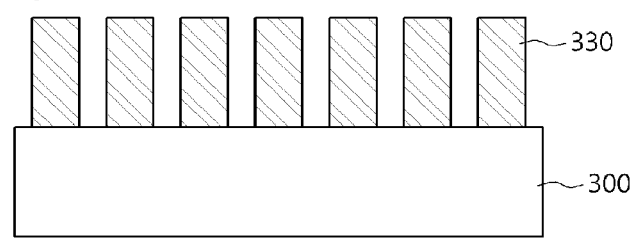

FIGS. 13 to 15 are cross-sectional views illustrating a method of fabricating a light-emitting diode in accordance with a third embodiment of the present invention.

Referring to FIG. 13, a preliminary etching layer 310 is formed on a lower substrate 300, which is the same as the first embodiment. The preliminary etching layer 310 may comprise Si, GaN, SiC, ZnO, GaAs, InP, AlN, ScAlMgO$_4$, or LiNbO$_3$. Preferably, the preliminary etching layer 310 may comprise zinc oxide in terms of a lattice constant with a layer, which will be formed later. When the preliminary etching layer 310 is formed of zinc oxide, the zinc oxide shows a preferential growth in the c-axis direction and may have n-type conductivity or have no conductivity.

Referring to FIG. 14, a photoresist pattern 320 is formed on the preliminary etching layer 310, and the preliminary etching layer 310 is selectively etched using the formed photoresist pattern 320 as an etching mask.

First, the photoresist pattern 320 is formed by normal lithography. That is, a photoresist is deposited on the preliminary etching layer 310 and patterned by lithography. Subsequently, the thus formed photoresist pattern 320 is used as an etching mask. The etching may be wet or dry etching and, preferably, the dry etching may be used. Moreover, the etching is performed in such a manner that the surface of the lower substrate 300 below the preliminary etching layer 310 is exposed. If any layer is interposed between the preliminary etching layer 310 and the lower substrate 300, the etching may be performed in such a manner that the corresponding layer is opened.

The residual structure of the preliminary etching layer 310 formed by etching using the photoresist pattern 320 is called crystalline rods 330. The shape of the crystalline rods 330 is determined by the shape of the photoresist pattern 320. Therefore, each of the crystalline rods 330 may have an independent rod shape or a stripe shape. Preferably, the crystalline rods 330 may have a regular arrangement.

Referring to FIG. 15, if the shape of the crystalline rods 330 is formed upon completion of the etching, the residual photoresist pattern is removed.

Subsequently, a light-emitting diode structure is formed on the crystalline rods 330, and an acceptor substrate is provided in the same manner as the first embodiment. That is, as shown in FIGS. 4 and 6, a light-emitting diode structure 140 is formed on crystalline rods 130, and an acceptor substrate 160 is provided on the light-emitting diode structure 140.

Next, an etching solution or an etching gas is supplied to the crystalline rods 330 to be dissolved, and thereby the lower substrate 300 and the light-emitting diode 140 are separated from each other, which is performed in the same manner as the first embodiment shown in FIG. 7. Therefore, the light-emitting diode structure 140 is attached only to the acceptor substrate 160, and the following process of forming the electrodes is performed. That is, a vertical type light-emitting diode is fabricated by the process of the first embodiment shown in FIGS. 4 to 8.

Besides, the following process for the crystalline rods 330 formed on the lower substrate 300 shown in FIG. 15 can be performed by the method described in the second embodiment.

That is, in the same manner as the second embodiment shown in FIGS. 9 and 10, a first semiconductor layer 240 and an acceptor substrate 260 are sequentially provided on the crystalline rods 330. Moreover, as shown in FIG. 11, the first semiconductor layer 240, to which the acceptor substrate 260 is attached, and the lower substrate 300 are separated from each other.

The separation of the lower substrate 300 is performed in the same manner as the first and second embodiments.

Then, an active layer 242 and a second semiconductor layer 244 are formed on the separated first semiconductor layer 240, and electrodes 270 and 280 are provided thereon, thus fabricating the vertical type light-emitting diode shown in FIG. 12.

Fourth Embodiment

Figure 16:
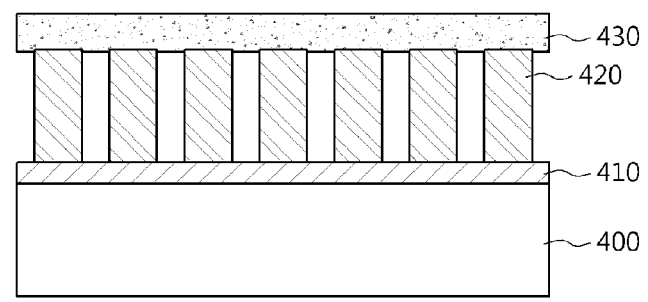
FIGS. 16 to 17 are cross-sectional views illustrating a method of separating layers from each other in accordance with a fourth embodiment of the present invention.
Figure 17:
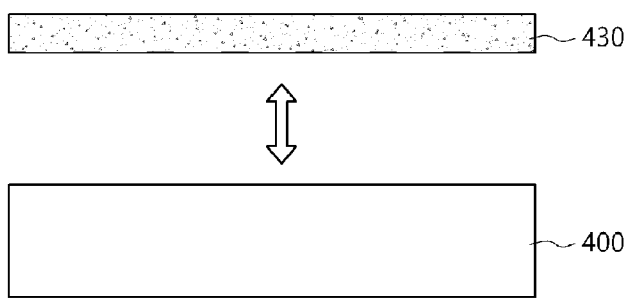

FIGS. 16 to 17 are cross-sectional views illustrating a method of separating layers from each other in accordance with a fourth embodiment of the present invention.

Referring to FIG. 16, a first layer 400 is provided. The first layer 400 may comprise sapphire, ITO, Si, GaN, SiC, ZnO, GaAs, InP, AlN, ScAlMgO$_4$, or LiNbO$_3$.

Crystalline rods 420 are formed on the first layer 400. The formation of the crystalline rods 420 is performed by the formation of a seed layer 410 and the growth of the crystalline rods 420. Especially, the crystalline rods 420 may comprise zinc oxide.

First, the seed layer 410 is formed on the first layer 400. The seed layer 410 may be formed by arranging zinc oxide particles on the first layer 400. The formation of the zinc oxide particles is performed in the same manner as the first embodiment. However, the zinc oxide particles may have various shapes, and already-formed zinc oxide particles may be used.

Moreover, the seed layer 410 may be formed by the sol-gel method described in the first embodiment. That is, the formation of the seed layer 410 by the sol-gel method is performed in the same manner as the first embodiment.

Alternatively, the seed layer 410 may be formed by a solution process such as spin-casting. The solvent, in which the zinc oxide particles are dispersed, may be a polar solvent. The polar solvent may be ethanol, isopropyl alcohol, water, or distilled water. Preferably, the polar solvent may contain both water and ethanol.

The seed layer 410 may be formed by evaporation, metal organic chemical vapor deposition (MOCVD), sputtering or coating using a brush.

Subsequently, a growth guiding layer having a plurality of holes is formed on the seed layer 410, and the crystalline rods 420 comprising zinc oxide are formed in the holes defined by the growth guiding layer. Preferably, one crystalline rod 420 may be formed in each hole of the growth guiding layer. Therefore, the crystalline rod 420 may have a nano-size.

The crystalline rods 420 may be formed by the hydrothermal synthesis method described in the first embodiment. For example, if the crystalline rods 420 comprising zinc oxide are formed by the hydrothermal synthesis method, the crystalline rods 420 may be formed using a predetermined growth solution. The formation of the crystalline rods 420 using the growth solution is performed in the same manner as the first embodiment. Therefore, the crystalline rods 420 are formed with a regular arrangement in the plurality of holes defined by the growth guiding layer.

The formation of the crystalline rods 420 can be achieved by the method described in the third embodiment.

That is, as shown in FIGS. 13 to 15, the crystalline rods 420 may be formed by providing a preliminary etching layer 310 on the first layer 400, instead of a lower substrate, and then selectively etching the preliminary etching layer 310. If the crystalline rods 420 are formed in the same manner as the third embodiment, the formation of the seed layer 410 may be omitted.

Then, a second layer 430 is formed on the crystalline rods 420. Preferably, the second layer 430 may be formed of a material having a chemical composition different from that of the crystalline rods 420. Moreover, any material that has an etch selectivity for a particular gas or solution may be used. Therefore, the second layer 430 may comprise Si, SiC, GaAs, GaP, AlGaInP, Ge, SiSe, GaN, AlInGaN, or InGaN.

Referring to FIG. 17, the first layer 400 and the second layer 430 are separated from each other by means of the crystalline rods 420 interposed between the first layer 400 and the second layer 430.

The separation of the two layers 400 and 430 is performed in the same manner as the first embodiment.

That is, the separation of the two layers 400 and 430 can be achieved by immersing the two layers 400 and 430 in an etching solution. The etching solution dissolves the crystalline rods 420 interposed between the two layers 400 and 430. If the crystalline rods 420 comprise zinc oxide, the etching solution may be an acidic solution. Any acidic etching solution may be used without any limitations. Preferably, the etching solution may have a pH of 3 to 6. The dissolution mechanism of the crystalline rods 420 can be represented by the above formula 15.

Moreover, the separation of the two layers 400 and 430 can be easily achieved by supplying an etching gas. That is, the separation of the two layers 400 and 430 can be achieved by supplying an etching gas to the crystalline rods 420 spaced from each other. The etching gas may be hydrogen or chlorine gas. The hydrogen or chlorine gas reacts with the zinc of the crystalline rods 420 comprising zinc oxide to produce by-products such as $ZnH_2$, $ZnCl_2$, etc.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

INDUSTRIAL APPLICABILITY

As described above, it is possible to easily separate a light-emitting diode structure or a layer constituting the structure from a substrate or another layer. The reason for this is that the material for crystalline rods such as ZnO can be easily dissolved by an acidic solution or a particular gas. Therefore, the layers can be easily separated from each other, and thus the fabrication of a vertical type light-emitting diode is facilitated.

The invention claimed is:

1. A method of fabricating a vertical type light-emitting diode, the method comprising:
    forming crystalline rods on a lower substrate by forming a seed layer on the lower substrate and allowing the crystalline rods to grow on the seed layer;
    after the formation of the seed layer, forming a growth guiding layer having a plurality of holes on the seed layer such that a part of the surface of the seed layer is exposed through the holes;
    forming a light-emitting diode structure on the crystalline rods;
    providing an acceptor substrate on the light-emitting diode structure; and
    separating the lower substrate from the light-emitting diode structure.

2. The method of claim 1, wherein the formation of the seed layer comprises:
    preparing a first solution by dissolving a hydrate containing zinc salt in a solvent;
    heating the first solution to form a sol;
    preparing a second solution by adding a surfactant to the solution in the sol state; and
    coating the second solution on the lower substrate and heating the resulting solution to form a gel.

3. The method of claim 2, wherein the zinc salt comprises zinc acetate, zinc nitrate, zinc sulfate, or zinc chloride.

4. The method of claim 1, wherein the formation of the seed layer comprises:
    preparing a first growth solution containing a first zinc salt and a first precipitator; and
    heating the first growth solution to form zinc oxide particles.

5. The method of claim 4, wherein the first zinc salt comprises zinc acetate, zinc nitrate, zinc sulfate, or zinc chloride.

6. The method of claim 4, wherein the first precipitator comprises NaOH, $Na_2CO_3$, LiOH, $H_2O_2$, KOH, or $NH_4OH$.

7. The method of claim 4, wherein the first growth solution further comprises a first overgrowth inhibitor and the first overgrowth inhibitor comprises a cationic polymer.

8. The method of claim 1, wherein the formation of the crystalline rods comprises:
    preparing a second growth solution containing a hydrate containing a second zinc salt, a second precipitator, and a second overgrowth inhibitor; and
    immersing the lower substrate including the seed layer in the second growth solution and applying heat energy thereto.

9. The method of claim 8, wherein the hydrate containing the second zinc salt comprises $Zn(NO_3)_2.H_2O$, $C_4H_6O_4Zn.2H_2O$, or $ZnSO_4.7H_2O$, the second precipitator comprises $C_6H_{12}N_4$, NaOH, or KOH, and the second overgrowth inhibitor comprises a cationic polymer.

10. The method of claim 1, wherein the formation of the crystalline rods comprises:
    forming a preliminary etching layer on the lower substrate; and
    selectively etching the preliminary etching layer to partially expose the lower substrate and allowing a part of the preliminary etching layer to remain and grow into the crystalline rods.

11. The method of claim 10, wherein the preliminary etching layer comprises ZnO.

12. The method of claim 1, wherein the formation of the light-emitting diode structure comprises:
    forming a first semiconductor layer on the crystalline rods;
    forming an active layer on the first semiconductor layer; and
    forming a second semiconductor layer having a complementary relationship with the first semiconductor layer on the active layer.

13. The method of claim 12, wherein the light-emitting diode structure comprises a group III-nitride.

14. The method of claim 12, further comprising, before the formation of the first semiconductor layer, forming a buffer layer on the crystalline rods.

15. A method of separating layers from each other, the method comprising:
    forming a seed layer on a first layer;
    forming a growth guiding layer having a plurality of holes on the seed layer such that a part of the surface of the seed layer is exposed through the holes;
    forming crystalline rods on the first layer;
    forming a second layer on the crystalline rods; and
    removing the crystalline rods to separate the first layer from the second layer.

16. The method of claim 15, wherein the first layer comprises sapphire, ITO, Si, GaN, SiC, ZnO, GaAs, InP, AlN, $ScAlMgO_4$, or $LiNbO_3$, and the second layer comprises Si, SiC, GaAs, GaP, AlGaInP, Ge, SiSe, GaN, AlInGaN, or InGaN.

17. The method of claim 15, wherein the crystalline rods are formed by a hydrothermal synthesis method using a hydrate containing zinc salt.

* * * * *